US007298612B2

(12) United States Patent
Malone (10) Patent No.: US 7,298,612 B2
(45) Date of Patent: Nov. 20, 2007

(54) SERVER WITH VERTICAL DRIVE ARRANGEMENT

(75) Inventor: Christopher G. Malone, Loomis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 70 days.

(21) Appl. No.: 11/259,467

(22) Filed: Oct. 25, 2005

(65) Prior Publication Data

US 2007/0091559 A1    Apr. 26, 2007

(51) Int. Cl.
*G06F 1/16*    (2006.01)

(52) U.S. Cl. ..................... 361/685; 720/601; 370/364; 361/695

(58) Field of Classification Search ................ 720/601; 370/364; 361/695–697, 679–687, 724–727
See application file for complete search history.

(56) References Cited

U.S. PATENT DOCUMENTS

| 6,614,652 | B2 * | 9/2003 | White et al. ................ 361/684 |
| 6,785,132 | B1 | 8/2004 | Medin et al. |
| 2005/0259395 | A1 * | 11/2005 | Espinoza-Ibarra et al. .. 361/695 |
| 2007/0006239 | A1 * | 1/2007 | Kasahara et al. ........... 720/601 |

* cited by examiner

*Primary Examiner*—Hung Van Duong (57) ABSTRACT

A planar backplane is arranged in a horizontal orientation in a server configured for rack mounting. The planar backplane is configured to accept and mount a plurality of disk drives in a vertical orientation in a dense server arrangement.

20 Claims, 12 Drawing Sheets

PRIOR ART

FIG. 9A

PRIOR ART

FIG. 9B

PRIOR ART

FIG. 9C

SERVER WITH VERTICAL DRIVE ARRANGEMENT

BACKGROUND OF THE INVENTION

Rack-optimized servers can have severe volumetric constraints resulting from market demand for multiple features and extensive functionality implemented within a chassis with a limited vertical height and limited depth. For example, a chassis is configured to house hard disk drives, Peripheral Component Interconnect (PCI) cards, processors, memory, and others. Chassis depth is commonly defined and limited by cable management constraints. For example, standard 36-inch deep racks may be the maximum allowable in light of bulkiness and/or electromagnetic interference reduction for rack input/output and power cable constraints.

Figure 9A:
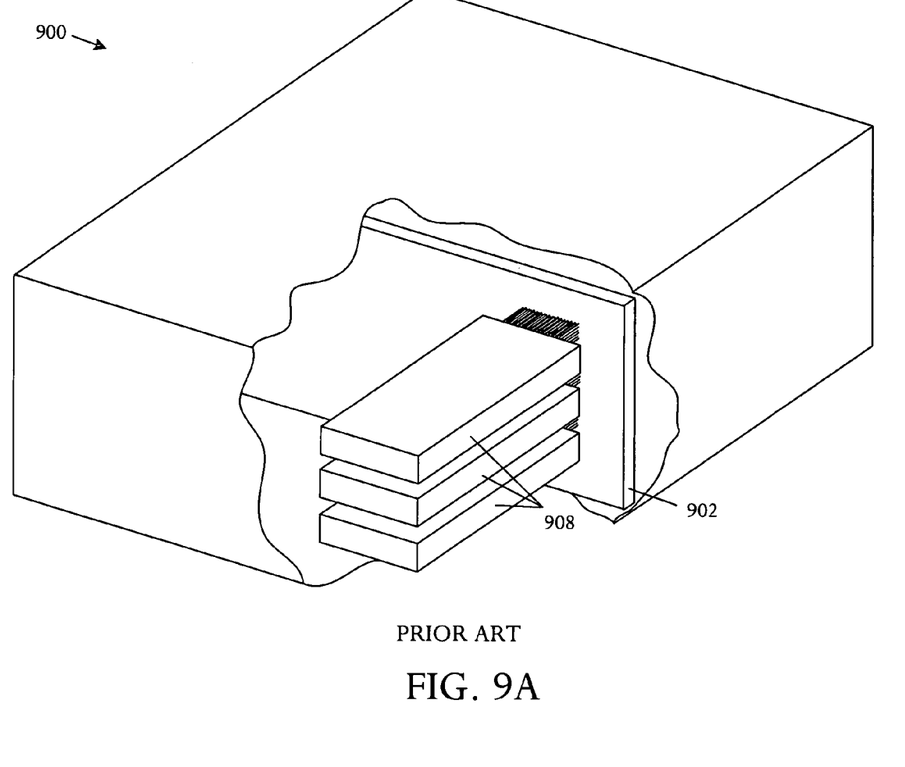
FIGS. 9A, 9B, and 9C, labeled PRIOR ART, are pictorial diagrams respectively showing a conventional server with horizontally-oriented disk drives and format of two conventional disk drives that are commonly installed for storage in a server.
Figure 9B:
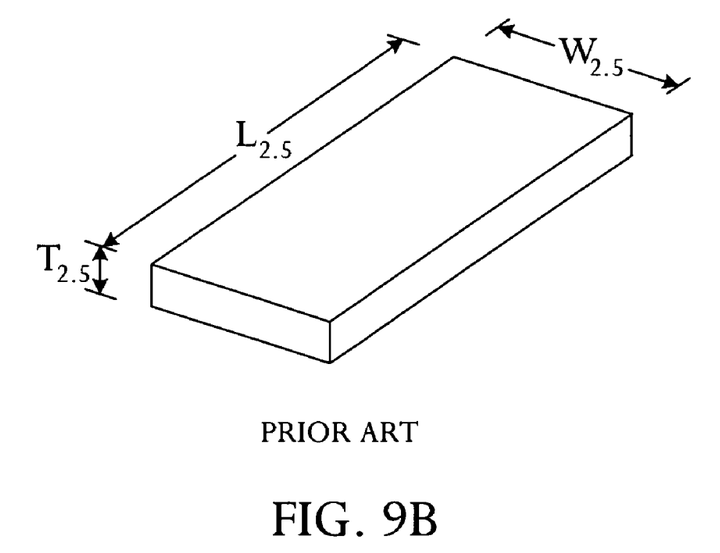
Figure 9C:
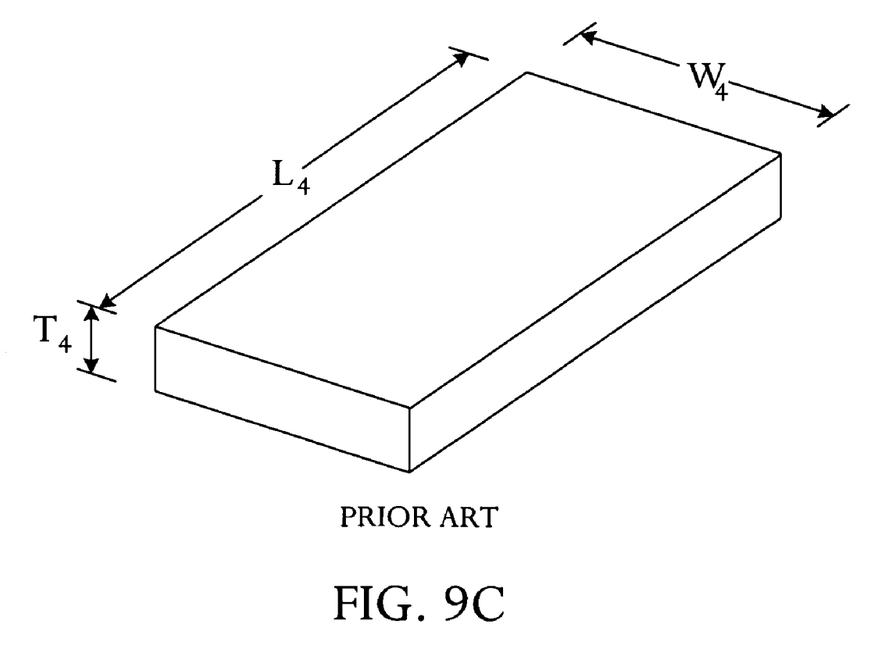

Typically, hard disk drives make electrical and power connection to server electronics via a vertical backplane as shown in FIG. 9A. The arrangement consumes a significant amount of the total available chassis depth due to the alignment of the longest dimension of the hard disk drive with chassis depth. FIGS. 9A and 9B show approximate volumes of two standard versions of hard disk drives used in servers. For example, a conventional four-inch format drive has a longest dimension or length ($L_4$) of 7.3 inches, a width ($W_4$) of 4.3 inches, and a thickness ($T_4$) of 1.05 inches. A conventional 2.5 format drive has a longest dimension or length ($L_{2.5}$) of 5.9 inches, a width ($W_{2.5}$) of 3 inches, and a thickness ($T_{2.5}$) of 0.62 inches. A typical arrangement may have a 0.045 inch gap between drives.

A further difficulty with the conventional vertical backplane arrangement is that the backplane is a solid impediment positioned essentially perpendicular to airflow pathways of cooling fans. Accordingly, the vertical backplane forms a blockage which obstructs airflow, creating a significant airflow resistance.

SUMMARY

In accordance with an embodiment of a server, a planar backplane is arranged in a horizontal orientation in a server configured for rack mounting. The planar backplane is configured to accept and mount a plurality of disk drives in a vertical orientation in a dense server arrangement.

BRIEF DESCRIPTION OF THE DRAWINGS

Embodiments of the invention relating to both structure and method of operation may best be understood by referring to the following description and accompanying drawings.

DETAILED DESCRIPTION

A server has a novel hard disk drive arrangement in which hard disk drives are vertically-oriented and connected to the server via a horizontal backplane.

Figure 1A:
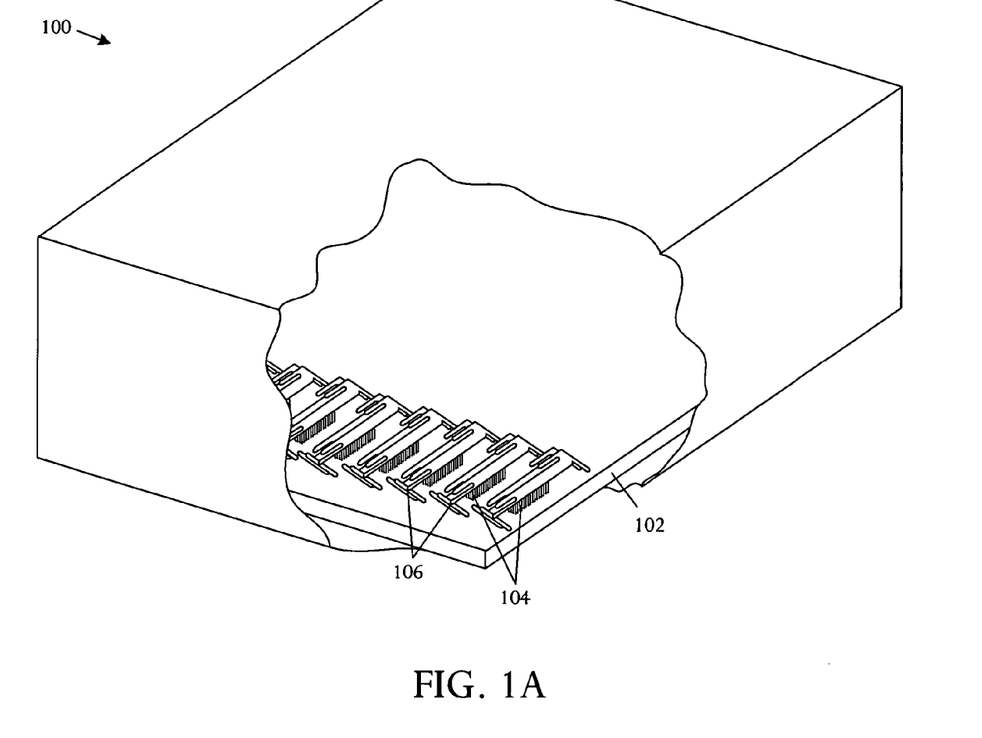
FIGS. 1A, 1B, and 1C are perspective, side, and frontal pictorial diagrams respectively illustrating an embodiment of a server internally arranged for vertical alignment of components enabling a dense architecture.
Figure 1B:
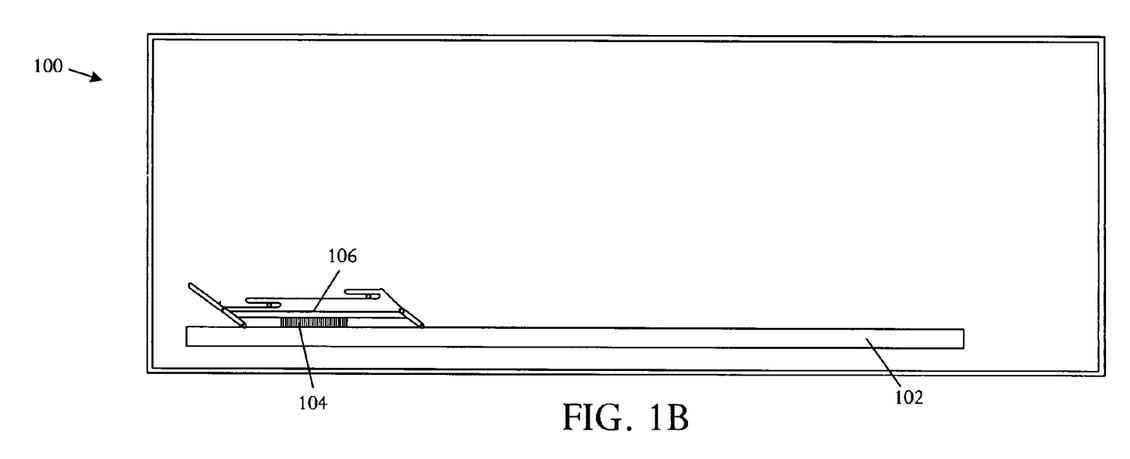
Figure 1C:
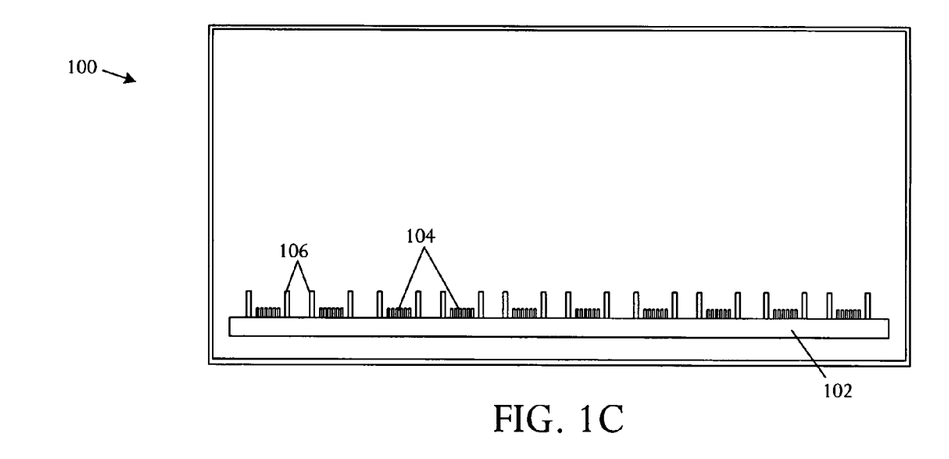

Referring to FIGS. 1A, 1B, and 1C, perspective, side, and frontal pictorial diagrams respectively illustrate an embodiment of a server 100 which is internally arranged for vertical alignment of components enabling a dense architecture. The server 100 comprises a planar backplane 102 adapted for operation in a horizontal orientation in the server 100 which is configured for rack mounting. The server 100 further comprises a plurality of disk drive connectors 104 coupled to the planar backplane 102 and configured to hold disk drives in a vertical orientation in a dense server arrangement.

In some arrangements, disk drives configured for vertical alignment in the server 100 are added or removed from the server 100 through top or bottom doors, covers, or panels on the server chassis, for example by sliding the drives into position similar to the manner of entry of horizontal drives into a conventional server. In other embodiments, the server 100 may be designed to facilitate installation and removal of disk drives from an entry way on a side of the server 100, for instance through a frontal orifice entry to the server interior. For example, hard disk drives can be inserted and removed from the front of the server using a four-bar linkage 106 which enables a drive to move with essentially pure horizontal motion while passing the drive into and out of the server 100 during installation and removal, and enables the drive to move with essentially pure vertical translations while engaging and disengaging the electrical and power connections by rotating a lever. The essentially pure horizontal motion and vertical translation have only minor incidental displacement in the direction outside the plane of the essentially pure motion.

Accordingly, the server 100 may further comprise one or more four-bar linkages 106 coupled to the planar backplane 102 and adapted to insert and remove disk drives from the disk drive connectors 104. The four-bar linkage 106 enables the disk drives to be installed and removed via a horizontal motion and engaged and disengaged via a vertical motion, facilitating drive access in a compact structure.

The configuration enables disk drives to be mounted aligning the disk drives' maximum dimension, the length, in the vertical orientation whereby server depth is reduced or minimized.

Figure 2:
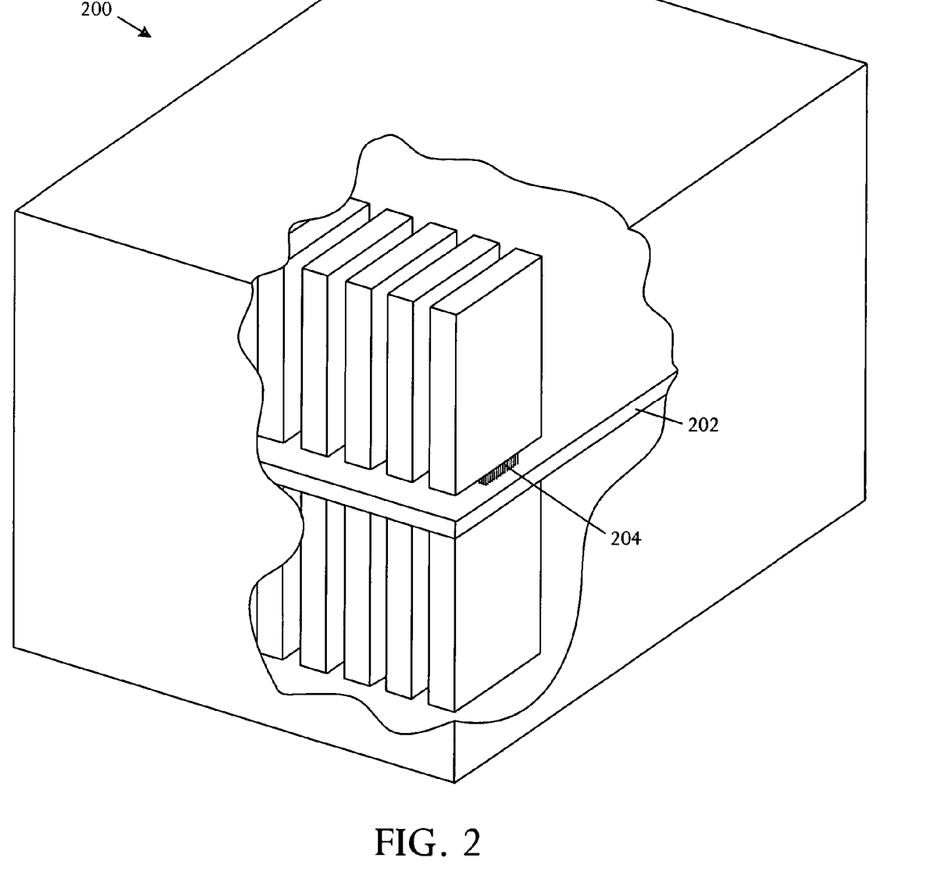
FIG. 2 is a perspective pictorial diagram showing an embodiment of a server implementing a double-sided backplane arranged to increase disk drive capacity.

FIGS. 1A, 1B, and 1C show a configuration in which drives can be loaded on one side of the backplane 102. The concept of a backplane arranged in a horizontal plane may be extended so that drives may be loaded on both sides of the backplane in conditions of sufficient vertical clearance. Referring to FIG. 2, a perspective pictorial diagram illustrates an embodiment of a server 200 which implements a double-sided backplane 202 arranged to increase disk drive capacity. The double-sided backplane 202 has a plurality of disk drive connectors 204 coupled to the top and bottom surfaces of the planar backplane 202. The disk drive connectors 204 are configured to hold disk drives in a vertical orientation in a dense server arrangement on both sides of the planar backplane 202.

The longest dimension of a disk drive is aligned in the vertical direction to conserve product depth, enabling, if desired, the conserved space to be used for other features. Conservation of product depth is highly valuable in many applications, for example Network Equipment Building Systems (NEBS) class products which have a stringent limited depth specification.

Figure 3A:
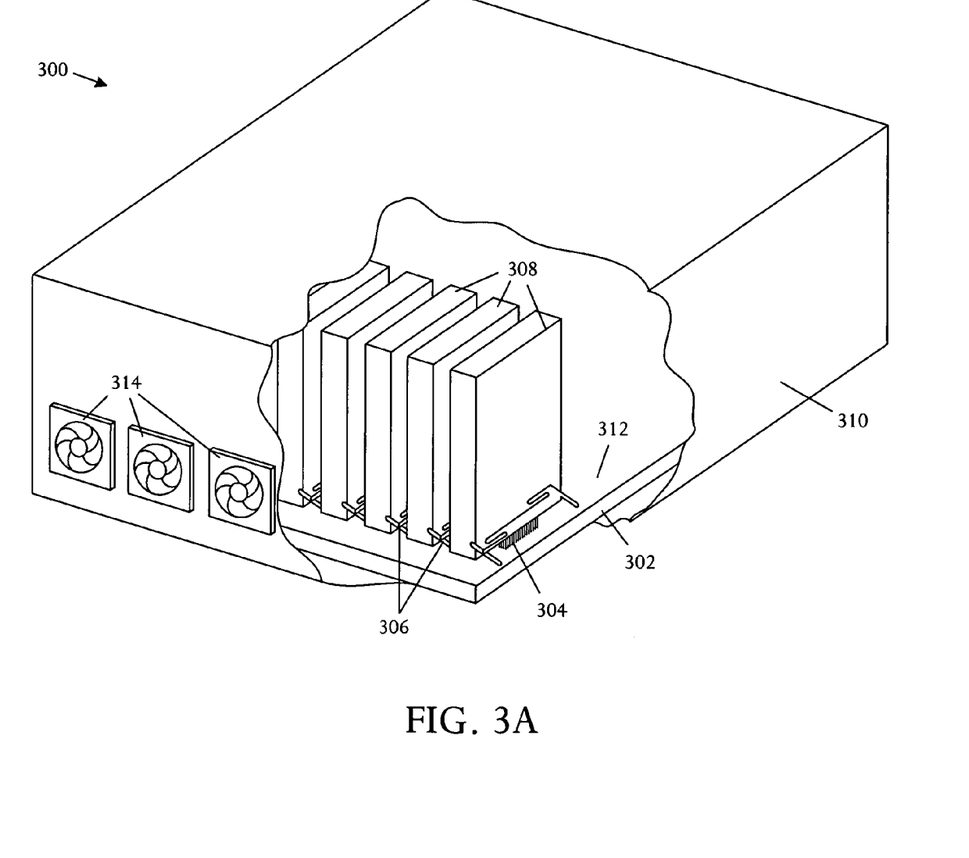
FIGS. 3A, 3B, and 3C are perspective, side, and frontal pictorial diagrams respectively depicting another embodiment of a server with one or more disk drives installed.
Figure 3B:
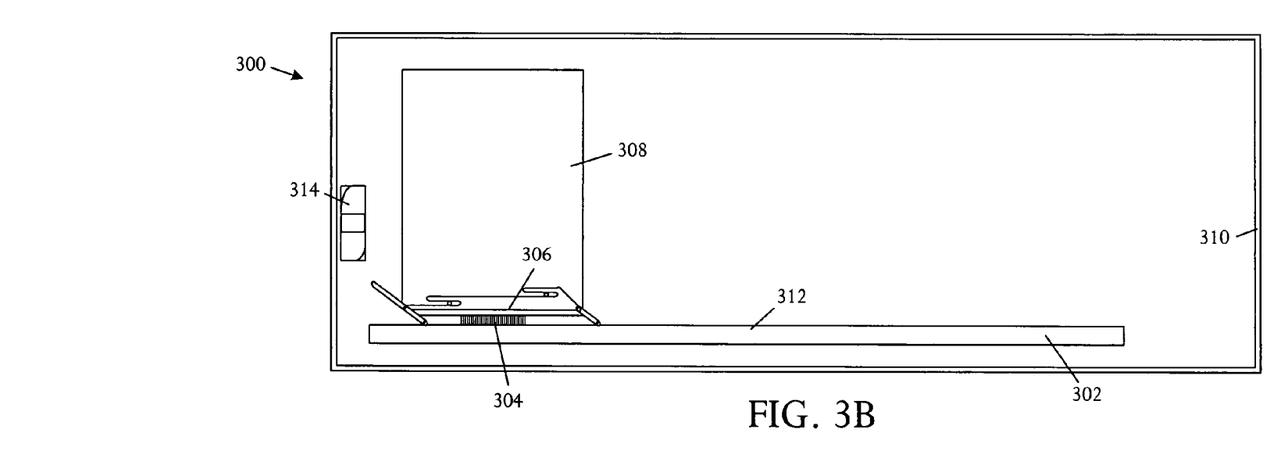
Figure 3C:
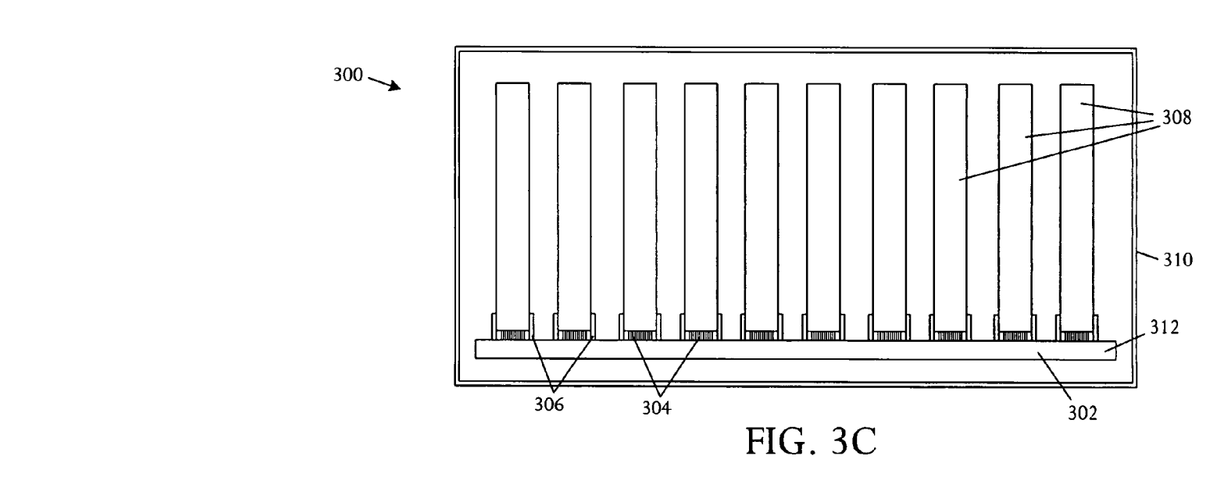

Referring to FIGS. 3A, 3B, and 3C, perspective, side, and frontal pictorial diagrams illustrate another embodiment of a server 300 with one or more disk drives 308 installed. The server 300 may further comprise a chassis 310 configured to contain the disk drives 308 and a planar backplane 302. The server 300 may further comprise one or more disk drives 308.

The server 300 may be configured with the planar backplane 302 arranged as a printed circuit assembly 312. Usage of the horizontal board 302 for hard disk drive connections may enable all functionality to be supported in an implementation with only a single printed circuit assembly 312, a configuration which may be produced at lower cost.

In a specific embodiment, a single printed circuit assembly 312 is populated with integrated circuits and devices which support all desired server functionality so that the server 300 is fully operational with only the single printed circuit assembly 312 installed.

The illustrative server 300 is arranged with one or more fans 314 positioned to direct airflow horizontally across the horizontally-oriented planar backplane 302. The fans 314 generate airflow pathways flowing laterally through the chassis 310, thereby cooling integrated circuits on the printed circuit assembly 312 and cooling the hard disk drives 308. The horizontal backplane 302 avoids obstruction of the airflow pathways and enables a lower airflow resistance in comparison to the conventional vertical backplane. The horizontal backplane 302 enables higher airflow rates and/or usage of lower cost, lower performance fans for server thermal systems.

Figure 4:
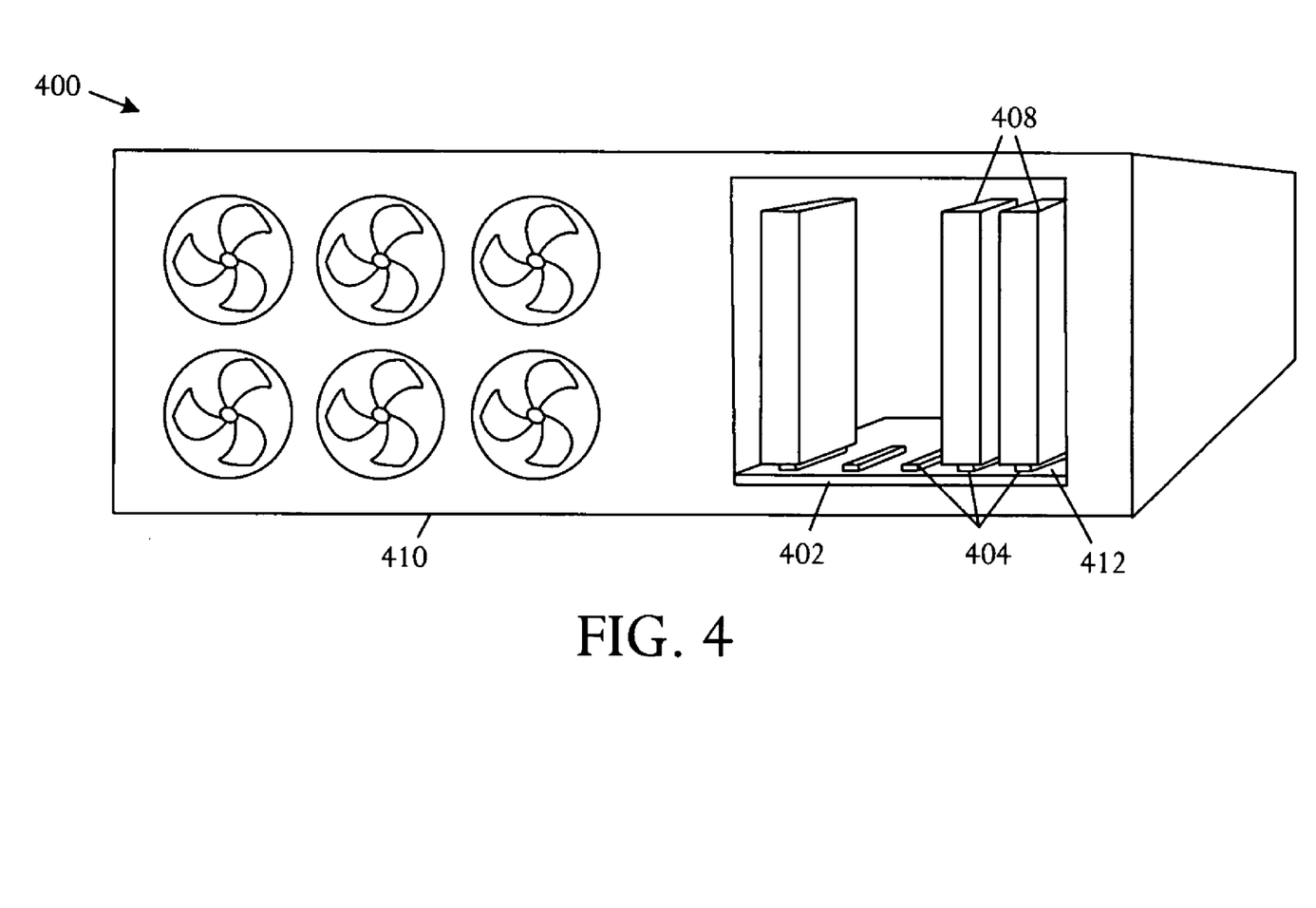
FIG. 4 is a perspective pictorial diagram illustrating another embodiment of a server with a densely-arranged configuration of disk drives.

Referring to FIG. 4, a perspective pictorial diagram illustrates another embodiment of a server 400 with a densely-arranged configuration of disk drives 408. The dense structure is formed by arranging a planar backplane 402 in a horizontal orientation in a server 400 which is configured for rack mounting. The planar backplane 402 is designed to accept and mount disk drives 408 in a vertical orientation in the dense server arrangement. The server 400 comprises a chassis 410 and a single printed circuit assembly 412 mounted interior to the chassis 410. The printed circuit assembly 412 comprises a planar backplane 402 adapted for operation in a horizontal orientation. The server 400 further includes one or more disk drives attached in a vertical orientation on the planar backplane 402.

The illustrative chassis 410 is configured to address volumetric constraints to support a wide variety of features inside the chassis 410, for example including hard disk drives 408, interfaces, processors, memory, and others in a minimum vertical height. Accordingly, the chassis 410 is designed to contain multiple disk drives 408 and the planar backplane 402. The server 400 depicted in FIG. 4 is designed in a reduced-cost implementation by arranging the horizontally-oriented planar backplane 402 as a printed circuit assembly 412 and configuring the server 400 to be fully functional with only the single printed circuit assembly 412.

The illustrative planar backplane 402 is configured to hold the disk drives 408 in a vertical orientation in a dense server arrangement. For example, the server 400 may be designed so that the disk drives 408 are mounted with the maximum disk drive dimension aligned in the vertical orientation, thereby reducing or minimizing server depth.

A conventional server 900, as depicted in FIG. 9A, hard disk drives 908 make electrical and power connections to server electronics via a vertical backplane 902. Disk drives 908 are typically installed into the server 900 by inserting the drives 908 into sockets in the vertical backplane 902 by horizontal motion from an opened side of the server 900 and pressing the drives 908 into the sockets with a suitable horizontally-directed force, typically a manual force. Servers implementing the horizontal backplanes shown in FIGS. 1A, 1B, 1C, 2, 3A, 3B, 3C, 5, and 6 support a larger number of hard disk drives with elevated density in comparison to the conventional arrangement shown in FIG. 9A.

Figure 5:
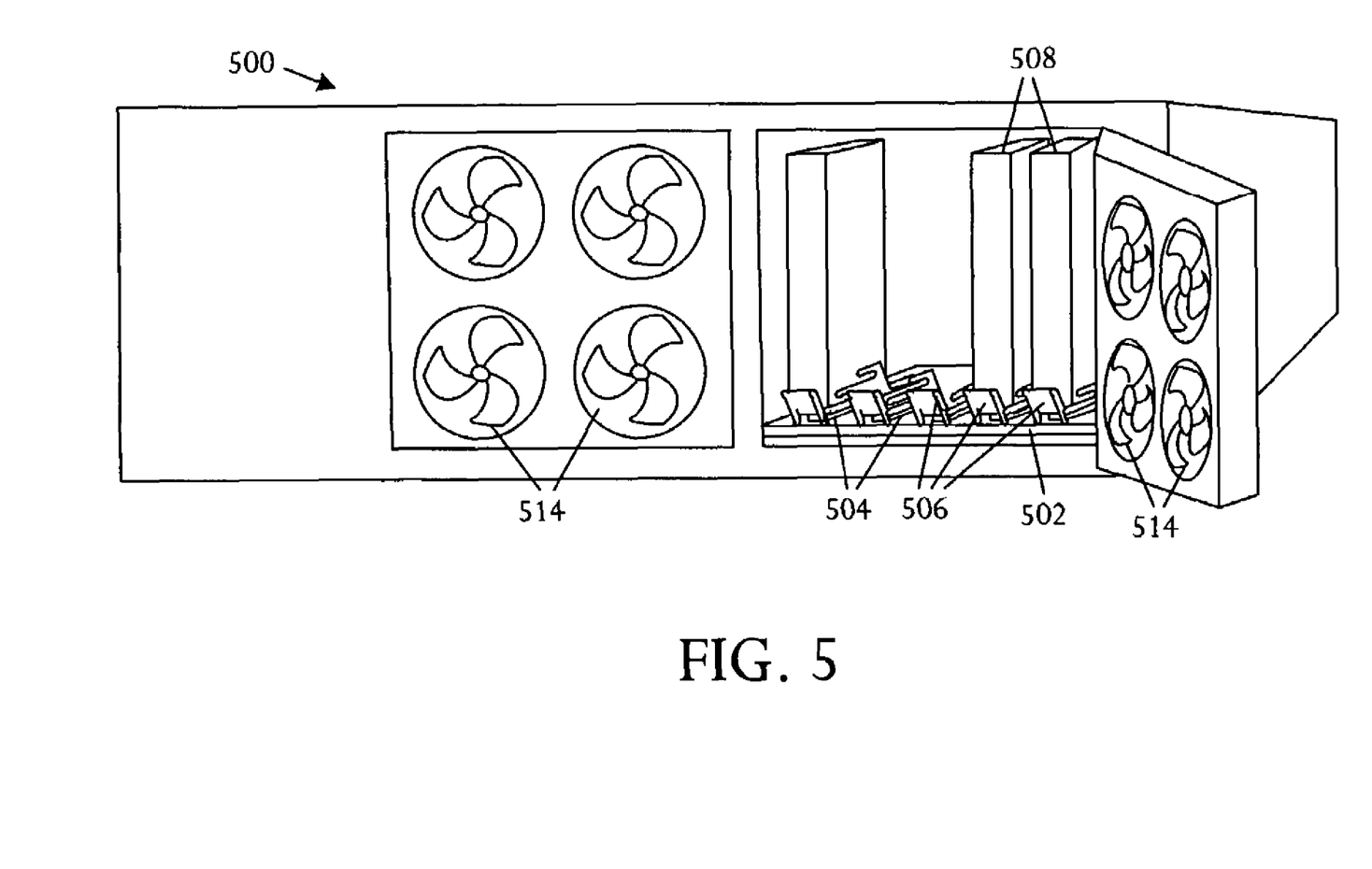
FIG. 5 is a perspective pictorial view showing a server with multiple disk drive connectors coupled to the top and bottom surfaces of the planar backplane and configured to hold disk drives in a vertical orientation in a dense server arrangement on both sides of the planar backplane.

Referring to FIG. 5, although some embodiments of a server may enable access to the server interior via doors or openings on top or bottom server panels, generally the server interior access is most convenient and efficient by doors on the front of the server 500. Doors on the server sides or back surfaces may also or alternatively supply interior access, typically with less convenience than frontal access, although more convenient than top or bottom surface doors.

Vertical insertion forces for mounting the vertically-oriented disk drives 508 may be difficult to apply for disk drives 508 inserted from doors on the front, back, or sides of the server 500. Accordingly, the server 500 can be designed with one or more four-bar linkages 506 couple to the planar backplane 502. Four-bar linkage elements 506 may be positioned to facilitate insertion and removal of disk drives 508 from disk drive connectors 504. The illustrative server 500 has one or more disk drive connectors 504 with associated four-bar linkage elements 506 coupled to the planar backplane 502. The four-bar linkage elements 506 are adapted to insert and remove disk drives from the disk drive connectors 504, enabling the disk drives 508 to be installed and removed via a horizontal motion and engaged and disengaged via a vertical motion.

The horizontal backplane 502 reduces airflow resistance in comparison to the conventional arrangement which implements the backplane in a vertical plane. One or more fans 514 are arranged to direct airflow horizontally across the horizontally-oriented planar backplane 502. Fans 514 may be arranged in a configuration that propels airflow through spatial planes between the disk drives 508 and horizontally across the horizontally-oriented planar backplane 502.

Figure 6:
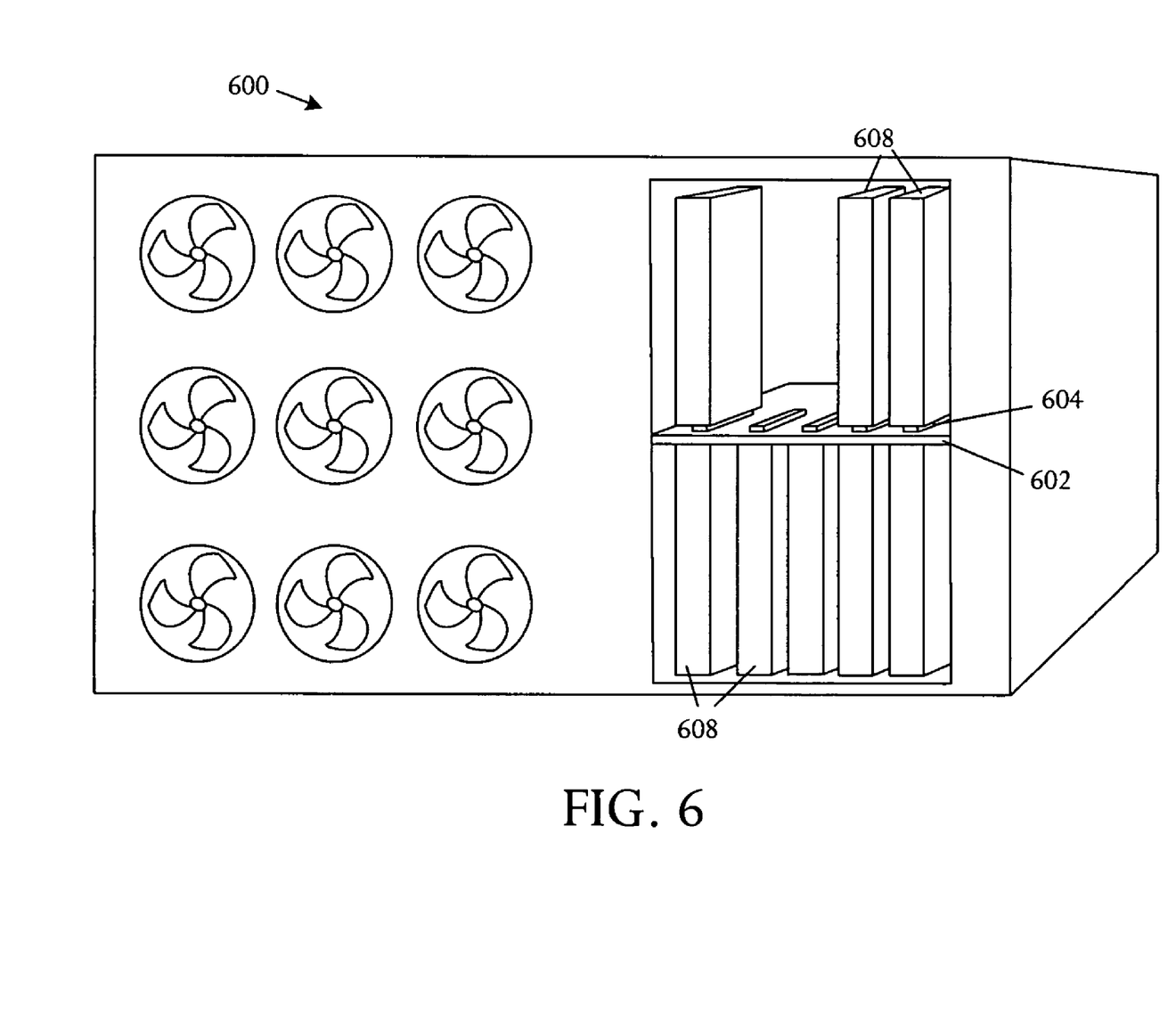
FIG. 6 is a perspective pictorial view depicting a server with multiple disk drives coupled on both sides of a planar backplane in a vertical orientation in a dense server arrangement.

In a design with sufficient vertical clearance, a horizontal backplane may be designed to mount disk drives on both top and bottom surfaces of the backplane. Referring to FIG. 6, a perspective pictorial view shows a server 600 with a plurality of disk drive connectors 604 coupled to the top and bottom surfaces of the planar backplane 602 and configured to hold disk drives 608 in a vertical orientation in a dense server arrangement on both sides of the planar backplane 602.

Figure 7:
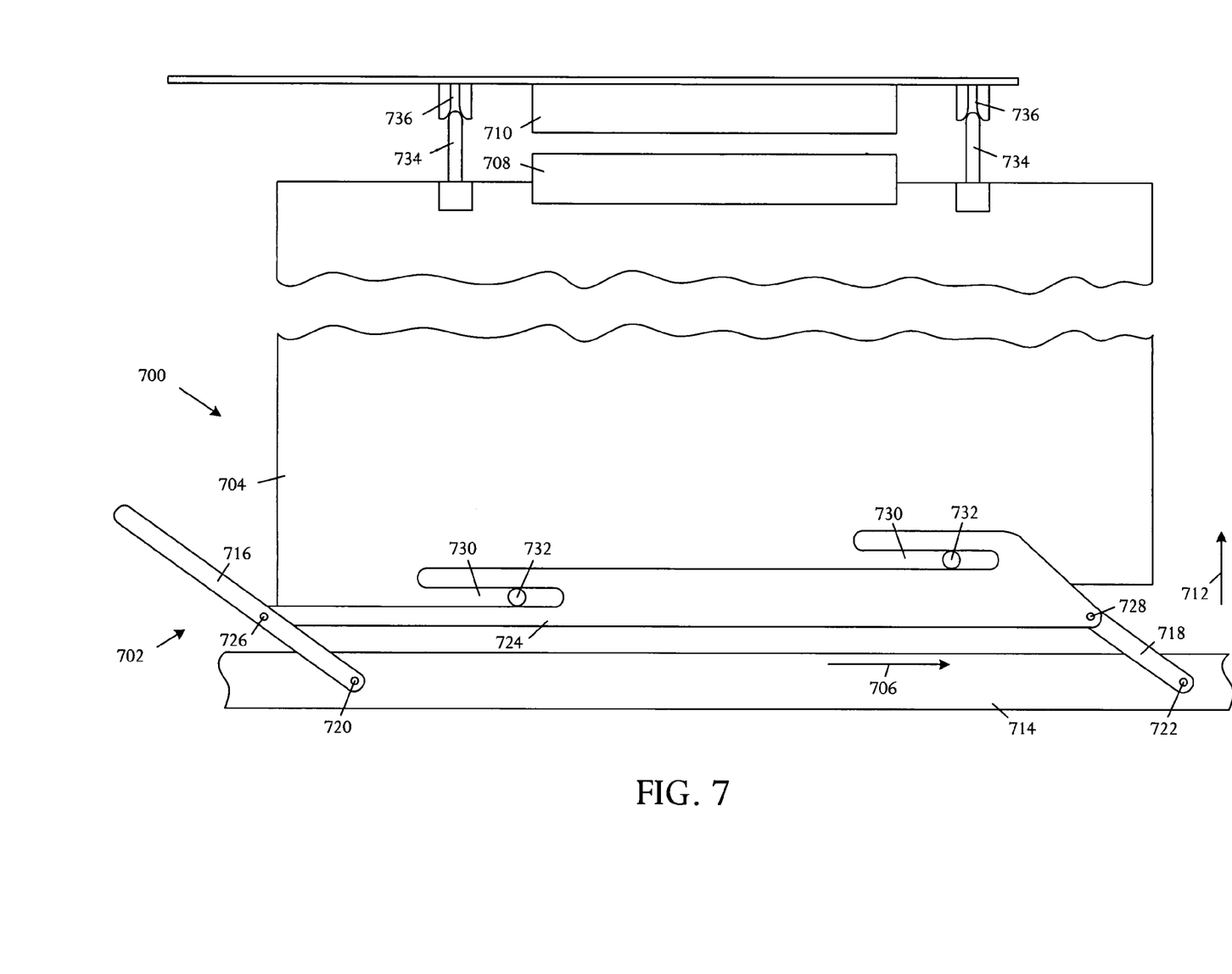
FIG. 7 is a pictorial drawing illustrating an embodiment of a disk drive connector engagement apparatus including a four-bar linkage adapted to couple to a server housing.

Referring to FIG. 7, a pictorial drawing illustrates an embodiment of a disk drive connector engagement apparatus 700 including a four-bar linkage 702 adapted to couple to a server housing. The four-bar linkage 702 is configured to accept and enable a disk drive 704 to travel in a first direction 706 until a connector 708 on the disk drive 704 and a corresponding backplane or midplane connector or socket 710 coupled to the housing are aligned. The four-bar linkage 702 further enables the disk drive 704 to travel essentially orthogonal 712 to the first direction to engage the connector 708 with the socket 710.

By definition, a four-bar linkage assembly has four axes of rotation connected by four rigid linkages.

In a particular example, the four-bar linkage 702 further includes a base link 714 that can be firmly affixed to the housing and forms a stationary link of the four-bar linkage 702. The four-bar linkage 702 also includes first 716 and second 718 rotating links, each of which is pivotally coupled to the base link 714 at pivots or hinges 720 and 722, respectively, and form movable levers of the four-bar linkage 702. At least one of the levers 716, 718 is accessible for manipulation and rotation to engage and disengage the connector 708 from the socket 710. The four-bar linkage 702 also has a coupler link 724 that is pivotally coupled to the first 716 and second 718 rotating links at pivots or hinges 726 and 728 and functions as a board guide for the disk drive 704.

The illustrative four-bar linkage 702 has slots 730 formed in the coupler link 724 configured to engage with pins and/or rollers 732 on the disk drive 704. The pins or rollers 732 transfer forces from the four-bar linkage 702 to the connector 708 The four-bar linkage 702 is configured so that rotation of an accessible lever, for example rotating link 716, translates the disk drive 704 in the first direction 706 and the orthogonal direction 712 so that pins 734 coupled to the disk drive 704 engage with corresponding apertures 736 in the housing, preventing further translation in the first direction 706, aligning the connector 708 and socket 710, and causing additional rotation of the accessible lever 716 to result in orthogonal motion alone to fully engage the connector 708.

The slots 730 have sufficient length to enable the disk drive 704 to be located in approximate alignment with the housing connector or socket 710.

In various embodiments, a four-bar linkage can be configured to engage a single connector to a single socket or multiple connectors on the disk drive to multiple sockets in the housing.

Figure 8:
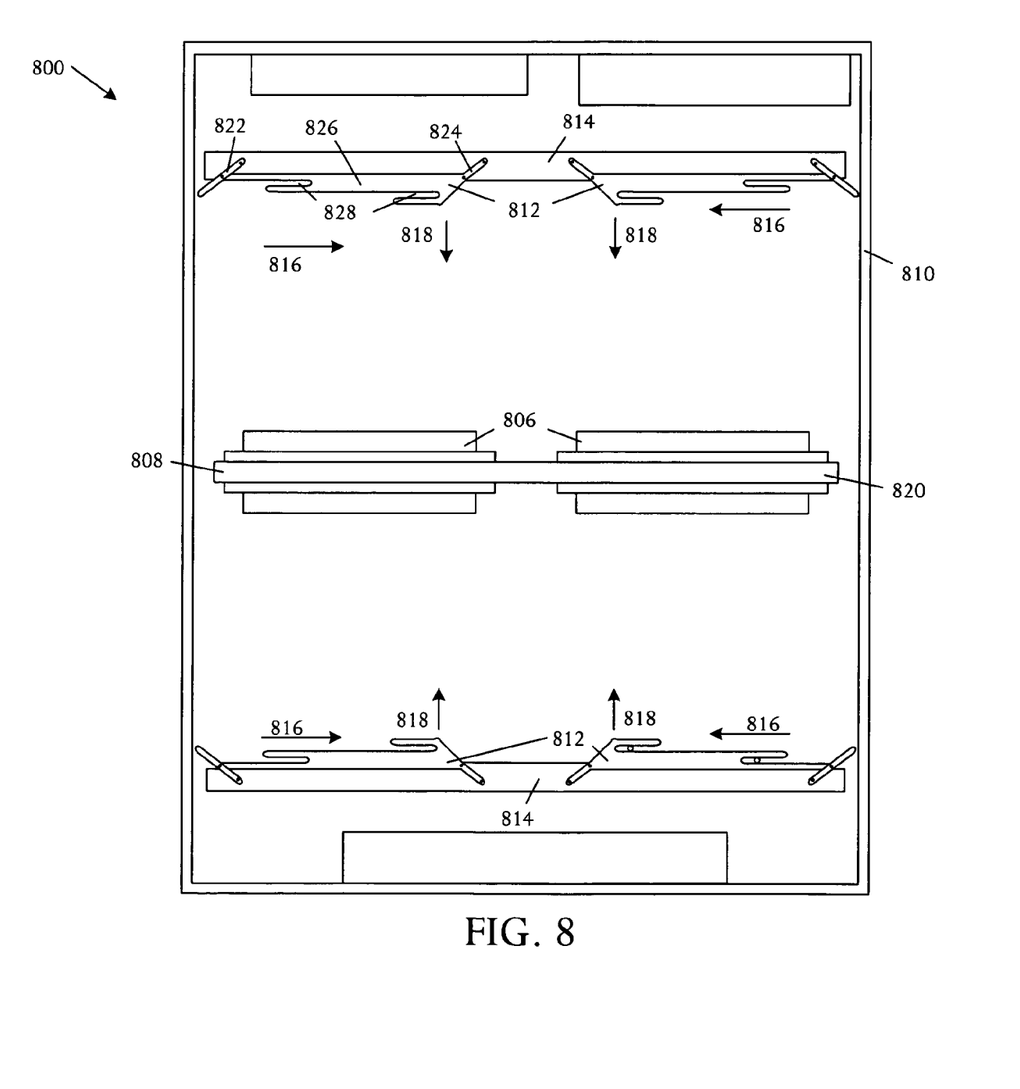
FIG. 8 is a schematic pictorial diagram which shows a side view of a server including four-bar linkage connectors for engaging and disengaging disk drives.

Referring to FIG. 8, a schematic pictorial diagram illustrates a side view of a server 800 that includes four-bar linkage connectors 802 for engaging and disengaging disk drives 804. A connector apparatus 802 includes a backplane or midplane socket 806 configured to couple to a first surface 808 of a server housing 810 and a four-bar linkage 812. The four-bar linkage 812 can be coupled to a second surface 814 of the server housing 810 that is substantially parallel with and opposing the first surface 808. The four-bar linkage 812 is configured to accept and enable a disk drive 804 to travel in a first direction 816 until a connector 802 on the disk drive 804 and the socket 806 are aligned, enabling the disk drive 804 to travel essentially orthogonal 818 to the first direction 816 to engage the connector 802 with the socket 806.

In the illustrative embodiment, the housing 810 is configured to accept a multiple disk drive 804 in a vertical layout so that vertical disk drives 804 connect to a horizontal backplane or midplane 820 coupled to the housing 810 with disk drives 804 loaded into the housing 810 from the front and/or rear of the housing 810.

The illustrative server 800 shown in FIG. 8 has sockets 806 positioned to receive disk drives 804 in both the front and rear portions of the housing 810 so that multiple disk drives 804 can be connected to the midplane or backplane 820 in multiple side-by-side columns and forward and rear rows. The illustrative server 800 has sockets 806 connected on both top and bottom sides of the horizontal midplane or backplane 820 so that the columns and rows of disk drives 804 can be inserted both above and below the midplane or backplane 820. Other configurations may accept more rows of disk drives or accept only a single row. Some configurations may accept disk drives on only a single side of the backplane.

The second surface 814 of the housing 810 forms a base or stationary link of the four-bar linkage 812. The four-bar linkage 812 further includes rotating links 822 and 824 that are pivotally coupled to the base link 814 and function as movable levers for manipulation and rotation, enabling engagement and disengagement of the disk drive connectors 802 from the sockets 806. A coupler link 826 is also pivotally coupled to the rotating links 822, 824 to complete the four-bar linkage 812 and operate as a disk drive guide. The four-bar linkage 812 is constructed to accommodate a disk drive 804, for example using slots 828 formed in the coupled link 826 in a geometry and position that enable engagement with pins and/or rollers 830 on a disk drive 804 that is configured for acceptance by the four-bar linkage 812.

The four-bar linkage 812 has a form that enables functionality in facilitating engagement and disengagement of a disk drive 804 from a socket 806. The rotating links 822, 824 include at least one lever that is accessible for manipulation. On rotation of the accessible lever, the disk drive is translated in a first direction 816, in the illustrative embodiment in a horizontal direction into the housing 810, and also in a direction 818 orthogonal to the first direction. Structures in the disk drives 804, for example guide pins, can be used to arrest the horizontal movement of the disk drive so that additional rotation of the lever causes the orthogonal, or vertical, motion alone to fully engage the connector 802 with the socket 806. In various embodiments, the disk drives may have single connectors or multiple connectors, and similarly single or multiple sockets may be configured to accept the connector or connectors.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, a few specific examples of horizontal-backplane servers are depicted. Any suitable architecture may be implemented, for example including multiple horizontal backplanes within a single chassis or a system with multiple columns of horizontal backplanes. The illustrative techniques may be used with any suitable data center configuration and with any suitable servers, computers, and devices.

In the claims, unless otherwise indicated the article "a" is to refer to "one or more than one."

What is claimed is:

1. A server comprising:
a planar backplane mounted in a horizontal orientation in a rack mount server; and
a plurality of disk drive connectors mounted to and extending vertically from the planar backplane that connect disk drives to the planar backplane and hold the disk drives in a vertical orientation in a dense server arrangement.

2. The server according to claim 1 further comprising:
a plurality of disk drive connectors coupled to the top and bottom surfaces of the planar backplane that connect the disk drives to the planar backplane and hold the disk drives in a vertical orientation in a dense server arrangement on both sides of the planar backplane.

3. The server according to claim 1 wherein:
the disk drives are mounted aligning a maximum disk drive dimension in the vertical orientation whereby server depth is minimized.

4. The server according to claim 1 further comprising:
at least one disk drive; and
a chassis configured to contain the at least one disk drive and the planar backplane.

5. The server according to claim 4 wherein:
the planar backplane is arranged as a printed circuit assembly; and
the server includes only the single printed circuit assembly.

6. The server according to claim 1 further comprising:
at least one fan arranged to direct airflow horizontally across the horizontally-oriented planar backplane.

7. A server comprising:
a planar backplane adapted for operation in a horizontal orientation in a server configured for rack mounting;
a plurality of disk drive connectors coupled to the planar backplane and configured to hold disk drives in a vertical orientation in a dense server arrangement; and
at least one four-bar linkage coupled to the planar backplane and adapted to insert and remove disk drives from the disk drive connectors, enabling the disk drives to be installed and removed via a horizontal motion and engaged and disengaged via a vertical motion.

8. A server comprising:
a chassis;
a single printed circuit assembly mounted interior to the chassis, the printed circuit assembly further comprising a planar backplane mounted in a horizontal orientation; and
at least one disk drive mounted to the planar backplane and attached in a vertical orientation on the planar backplane.

9. The server according to claim 8 wherein:
the planar backplane connects the at least one disk drive to the planar backplane to hold the at least one disk drive in a vertical orientation in a dense server arrangement.

10. The server according to claim 8 further comprising:
a plurality of disk drive connectors coupled to the top and bottom surfaces of the planar backplane that connect the disk drives to the planar backplane and hold the disk drives in a vertical orientation in a dense server arrangement on both sides of the planar backplane.

11. The server according to claim 8 wherein:
the disk drives are mounted aligning a maximum disk drive dimension in the vertical orientation whereby server depth is minimized.

12. The server according to claim 8 further comprising:
at least one fan arranged to direct airflow horizontally across the horizontally-oriented planar backplane in airflow channels between the vertically oriented disk drives whereby flow resistance is reduced.

13. A server comprising:
a chassis;
a single printed circuit assembly mounted interior to the chassis, the printed circuit assembly further comprising a planar backplane adapted for operation in a horizontal orientation;
at least one disk drive attached in a vertical orientation on planar backplane; and
at least one four-bar linkage coupled to the planar backplane and adapted to insert and remove disk drives from the disk drive connectors, enabling the disk drives to be installed and removed via a horizontal motion and engaged and disengaged via a vertical motion.

14. A method comprising:
arranging a planar backplane in a horizontal orientation in a rack mount server; and
configuring the planar backplane to connect to and mount a plurality of disk drives on at least one planar side of the planar backplane in a vertical orientation in a dense server arrangement.

15. The method according to claim 14 further comprising:
configuring the planar backplane to connect to and mount the plurality of disk drives on at least one planar side of the planar backplane in a vertical orientation on top and bottom planar backplane surfaces.

16. The method according to claim 14 further comprising:
configuring the planar backplane to connect to and mount the plurality of disk drives on at least one planar side of the planar backplane in an alignment with a maximum disk drive dimension in the vertical orientation whereby server depth is minimized.

17. The method according to claim 14 further comprising:
configuring a chassis to contain the at least one disk drive and the planar backplane;
arranging the planar backplane as a printed circuit assembly; and
configuring the server to include only the single printed circuit assembly.

18. The method according to claim 14 further comprising:
arranging at least one fan to direct airflow horizontally across the horizontally-oriented planar backplane in airflow channels between the vertically oriented disk drives whereby flow resistance is reduced.

19. A method comprising:
arranging a planar backplane in a horizontal orientation in a server configured for rack mounting;
configuring the planar backplane to accept and mount a plurality of disk drives in a vertical orientation in a dense server arrangement; and
coupling at least one four-bar linkage to the planar backplane; and
adapting the at least one four-bar linkage to insert and remove disk drives from the disk drive connectors.

20. The method according to claim 19 further comprising:
configuring the at least one four-bar linkage to install and remove the disk drives in a horizontal motion and to engage and disengage the disk drives in a vertical motion.

* * * * *

UNITED STATES PATENT AND TRADEMARK OFFICE
CERTIFICATE OF CORRECTION

PATENT NO. : 7,298,612 B2 Page 1 of 1
APPLICATION NO. : 11/259467
DATED : November 20, 2007
INVENTOR(S) : Christopher Malone It is certified that error appears in the above-identified patent and that said Letters Patent is hereby corrected as shown below:

In column 8, line 12, in Claim 13, after "on" insert -- the --.

Signed and Sealed this

Seventeenth Day of June, 2008

JON W. DUDAS
*Director of the United States Patent and Trademark Office*